(12) United States Patent
Zheng et al.

(10) Patent No.: US 12,421,107 B2
(45) Date of Patent: Sep. 23, 2025

(54) MANUFACTURING METHOD FOR GRAPHITE SLIDER ARRAYS

(71) Applicants: RESEARCH INSTITUTE OF TSINGHUA UNIVERSITY IN SHENZHEN, Guangdong (CN); TSINGHUA UNIVERSITY, Beijing (CN)

(72) Inventors: Quanshui Zheng, Beijing (CN); Haiyang Jiang, Beijing (CN); Kaiwen Tian, Guangdong (CN)

(73) Assignees: RESEARCH INSTITUTE OF TSINGHUA UNIVERSITY IN SHENZHEN, Guangdong (CN); TSINGHUA UNIVERSITY, Beijing (CN)

( * ) Notice: Subject to any disclaimer, the term of this patent is extended or adjusted under 35 U.S.C. 154(b) by 449 days.

(21) Appl. No.: 17/923,254

(22) PCT Filed: Jun. 28, 2020

(86) PCT No.: PCT/CN2020/098477
§ 371 (c)(1),
(2) Date: Nov. 4, 2022

(87) PCT Pub. No.: WO2022/000120
PCT Pub. Date: Jan. 6, 2022

(65) Prior Publication Data
US 2024/0043266 A1 Feb. 8, 2024

(51) Int. Cl.
*B81C 1/00* (2006.01)
*B81B 5/00* (2006.01)
(Continued)

(52) U.S. Cl.
CPC .......... *B81C 1/00198* (2013.01); *B81B 5/00* (2013.01); *B81C 1/00* (2013.01); *B81C 1/00206* (2013.01); *C01B 32/00* (2017.08); *C01B 32/20* (2017.08)

(58) Field of Classification Search
None
See application file for complete search history.

(56) References Cited

U.S. PATENT DOCUMENTS

2012/0088039 A1    4/2012    Yu et al.

FOREIGN PATENT DOCUMENTS

| CN | 103011140 A | 4/2013 |
| CN | 103121659 A | 5/2013 |

(Continued)

OTHER PUBLICATIONS

European Search Report issued by the European Patent Office in connection with International Application No. 20942675.8, dated Jun. 26, 2023.

(Continued)

*Primary Examiner* — Jiong-Ping Lu
(74) *Attorney, Agent, or Firm* — George Likourezos; Carter, DeLuca & Farrell LLP

(57) ABSTRACT

Provided is a manufacturing method for graphite slider arrays in batches. In this method, a grain structures examination step is added to a process of manufacturing graphite slider arrays, and a subsequent etching step is controlled so that only one horizontal grain boundary exists inside the graphite mesas, and when cleaved, the sliders slide away on the only grain boundary. The slider arrays prepared by this method have uniform easy-slip surfaces and thickness with good consistency.

10 Claims, 3 Drawing Sheets

(51) Int. Cl.
*C01B 32/00* (2017.01)
*C01B 32/20* (2017.01)

(56) References Cited

FOREIGN PATENT DOCUMENTS

| | | | |
|---|---|---|---|
| CN | 103438348 A | | 12/2013 |
| CN | 109827700 A | | 5/2019 |
| CN | 109935244 | * 6/2019 | ............. G11B 5/255 |
| CN | 109949832 A | | 6/2019 |
| CN | 109979490 A | | 7/2019 |
| JP | 2012184841 A | | 9/2012 |
| WO | 2009108936 A1 | | 9/2009 |
| WO | 2019172023 A1 | | 9/2019 |

OTHER PUBLICATIONS

Cheng Zhang, et al., "Micro-fabrication method of graphite mesa microdevices based on optical lithography technology", Journal of Micromechanics and Microengineering, pp. 1-6, 2017.
Quanshui Zheng, et al., "Experimental advances in superlubricity", Friction Research Article, pp. 1-11, 2014.
Quanshui Zheng, "Super lubrication: A world of "zero" friction", pp. 1-16, 2016.
Cangyu Qu, et al., "Origin of Friction in Superlubric Graphite Contacts", Physical Review Letters 125, pp. 1-6, 2020.
Quanshui Zheng, et al., "Self-Retracting Motion of Graphite Microflakes", Physical Review Letters, pp. 1-4, Feb. 15, 2008.
International Search Report issued by the China National Intellectual Property Administration (ISA/CN) in connection with International Application No. PCT/CN2020/098477, dated Mar. 25, 2021, pp. 1-3, with English-language translation.
Liu, Z. et al., "Observation of Microscale Superlubricity in Graphite" Physical Review Letters (May 2012) pp. 205503-1 205503-5, vol. 108, No. 20.
Kunqi Wang, et al., "Characterization of a Microscale Superlubric Graphite Interface", Physical Review Letters 125, pp. 1-6, 2020.
Chinese First Search Report issued by the China National Intellectual Property Administration in connection with International Application No. 202080092510X, dated Mar. 4, 2025. English Translation Attached.
Chinese Office Action issued by the China National Intellectual Property Administration in connection with International Application No. 202080092510X, dated Mar. 6, 2025. English Translation Attached.
Song Yiming, et al., "Robustness structural superslip in a micronscale graphite/hexagonal boron nitride layered heterojunction", National Academic Conference on Solid Mechanics, pp. 1-3, Nov. 2018.
Yiming Song, et al., "Structural Superlubricity Based on Crystalline Materials", Small, pp. 1010, 2019.
Korean Notice of Allowance issued by the Korean Patent Office in connection with International Application No. 10-2022-7038944, dated Jan. 23, 2025. English Translation Attached.

* cited by examiner

MANUFACTURING METHOD FOR GRAPHITE SLIDER ARRAYS

CROSS-REFERENCE TO RELATED APPLICATION

This is a national stage application filed under 37 U.S.C. 371 based on International Patent Application No. PCT/CN2020/098477, filed on Jun. 28, 2020, and disclosure of which is incorporated herein by reference in its entirety.

TECHNICAL FIELD

The present disclosure relates to the field of structural superlubricity and, in particular, to a manufacturing method for graphite slider arrays in batches.

BACKGROUND

For a long time, the problem of friction and wear not only closely relates to manufacturing but also directly relates to energy, environment and health. According to statistics, friction dissipates about one third of the energy in the world and around 80% of the failure of machine components result from wear. Structural superlubricity (SSL) technology is one of the ideal solutions to solve the problem of friction and wear. The SSL is the state of nearly vanishing friction and no wear between two van der Waals solid surfaces (such as surfaces of graphene, molybdenum disulfide and other two-dimensional materials) that are smooth in atomic scale and in incommensurate contact with each other. In 2004, the research group of Prof. J. Frenken measured the friction force between a graphite sheet with a size of a few nanometers (about 100 carbon atoms in total) stuck on a probe and a crystal plane of highly oriented pyrolytic graphite (HOPG) and provided the first experimental confirmation of the existence of nanoscale superlubricity. In 2013, Prof. Quanshui Zheng' group realized SSL at the micron scale for the first time by using HOPG, opening the door for SSL to go from basic research to engineering applications.

In the existing process of manufacturing graphite slider arrays, due to the polycrystalline structure of HOPG, multiple grain boundaries exist inside the HOPG, and the graphite mesa may be cleaved at any of the lateral grain boundary layers. Therefore, it is difficult to control the height of the easy-slip interface of the graphite mesa. Affected by this factor, the graphite slider arrays manufactured in batches through the existing method has a poor consistency. Specifically, the following two problems arise.

1. Due to the polycrystalline structure of the graphite material, during the processing of the graphite sliders, one graphite mesa may be exactly processed across the longitudinal grain boundaries. When the graphite mesa is cleaved to form a graphite slider, those longitudinal grain boundaries will cause large friction, so that the graphite slide cannot achieve SSL.

2. In addition, even if a graphite mesa contains no longitudinal grain boundaries, it may still contain several horizontal grain boundaries due to the uncertainty of the etching depth. These horizontal grain boundaries are easy-slip interfaces in the graphite mesa. When the graphite mesa is cleaved, the (upper) graphite mesa may slide away on any of these horizontal grain boundary layers. When a large number of graphite sliders are manufactured in batches, the heights of the easy-slip interfaces are not consistent. Therefore, the qualities of the graphite sliders (such as thickness) cannot be uniformly controlled.

SUMMARY

Technical Problems

To overcome shortcomings of the existing art, the present disclosure is to provide the following solutions: a step of grain structure examination is added to a process of manufacturing graphite slider arrays, and a subsequent etching step is controlled so that only one horizontal grain boundary layer exists inside the graphite mesa. When the graphite mesa is cleaved to form a graphite slider, the graphite slider slides away on the only horizontal grain boundary layer.

Technical Solutions

To achieve the object of the present disclosure, technical solutions adopted by the present disclosure are a manufacturing method for graphite slider arrays that includes steps described below.

In step 1, HOPG is covered with at least photoresist.

In step 2, the photoresist is patterned and a plurality of photoresist mesas is retained.

In step 3, the HOPG is etched and part of the HOPG that is not protected by the photoresist is removed, so as to form a plurality of graphite mesas.

In step 4, residual photoresist is removed so as to obtain the graphite slider arrays.

Before the step 1, examination is performed on three-dimensional grain structures near the surfaces of the HOPG to obtain grain information of polycrystalline structures near the surfaces of the HOPG.

In the step 3, based on the grain information of the polycrystalline structures, etching time is controlled so that each graphite mesa includes only one horizontal grain boundary layer.

Further, in the step 1, the HOPG is covered by photoresist through spin-coating.

Further, the average size of each photoresist mesa formed in the step 2 is preferably 1 μm to 30 μm, and the average interval between the photoresist mesas is preferably 1 μm to 100 μm.

Further, the etching in the step 3 is reactive ion etching (RIE).

Further, the examination is electron backscatter diffraction (EBSD), X-ray scattering, or ellipsometry.

Further, the grain information includes a grain thickness.

Further, etching time is controlled to make the etching depth greater than a thickness of a grain of an outermost layer of the graphite and less than a distance from the outermost layer of the graphite to a bottom of a second grain of the graphite.

Further, each graphite mesa is covered by a connection layer (9) on a top of the each graphite mesa.

Further, the connection layer (8) is deposited on the HOPG by a plasma chemical vapor deposition (CVD) method to form the connection layer (9) on the top of the each graphite mesa.

Further, a material of the connection layer (8) is preferably $SiO_2$, and a thickness of the connection layer (8) is preferably 50 nm to 500 nm.

Beneficial Effect

It can be seen from the technical solutions of the present disclosure that the existing method for manufacturing graphite slider arrays does not have the grain structure examination before processing so that the etching depth cannot be strictly controlled. Therefore, the processed graphite slider arrays include a large number of grain boundaries (easy-slip interfaces).

Therefore, the graphite sliders manufactured in this way are not consistent. The graphite slider arrays manufactured in the present disclosure have uniform easy-slip surfaces and thickness.

REFERENCE LIST

Figure 1:
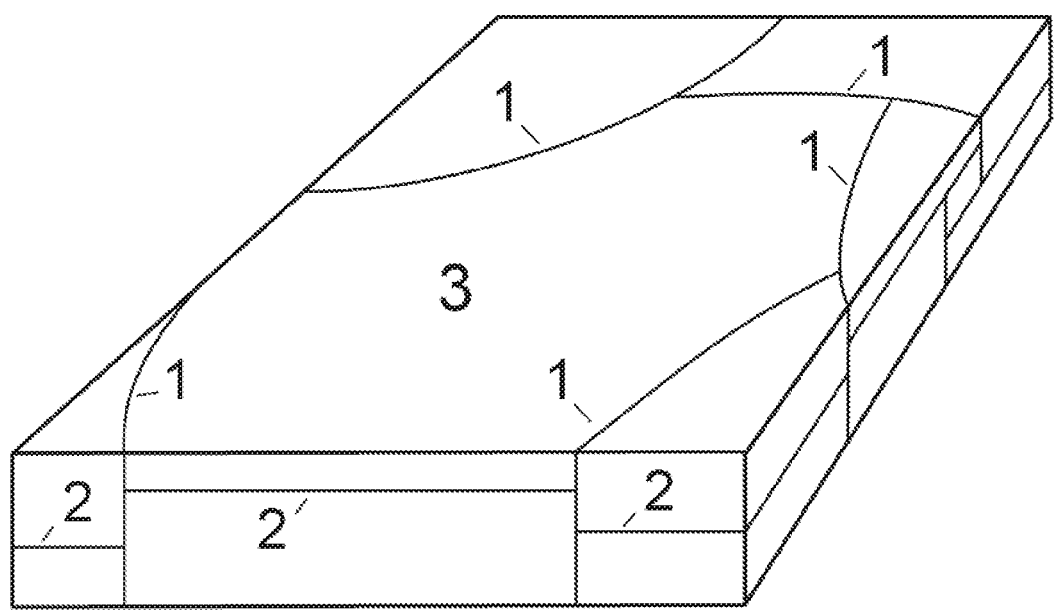
FIG. 1 is a schematic diagram of typical expected results for non-destructive three-dimensional examination of HOPG according to the present disclosure.

1 longitudinal grain boundaries extending from the graphite surfaces to the interior
2 horizontal grain boundaries inside the graphite
3 single crystal region with a relative large area
4 patterned photoresist
5 slip interface in the graphite mesa
6 graphite mesa substrate
7 graphite slider
8 connection layer
9 connection layer on the top of the graphite mesa

DETAILED DESCRIPTION

A manufacturing method for graphite sliders in the present disclosure is described in detail below with reference to the drawings.

In the step 1, a HOPG is selected which has relatively flat surfaces and layered structures and has single crystal grains with a large size and a large thickness.

Optionally, the single crystal graphite or the poly crystal graphite with a relatively high flatness may also be selected. The single crystal graphite or the poly crystal graphite is self-grown and is non-standardized.

In the step 2, through non-destructive examination on three-dimensional grain structures near surfaces of the HOPG, information of polycrystalline structures near the surfaces of the HOPG is obtained. The non-destructive examination method could be, for example, EBSD, X-ray scattering, ellipsometry, and the like. An example of expected measurement results is shown in FIG. 1. Highly oriented graphite has polycrystalline mosaic-like structures similar to "bricks" and includes several longitudinal grain boundaries 1 extending from graphite surfaces to the interior and several horizontal grain boundaries 2 inside the graphite. Positions of these grain boundaries could be accurately measured. According to grain structure information provided by the examination, a single crystal region 3 with a relatively large area could be accurately selected on the surfaces of the HOPG.

In the step 3, the HOPG is covered by the photoresist. Optionally, the HOPG is covered by the photoresist with spin-coating.

Figure 2:
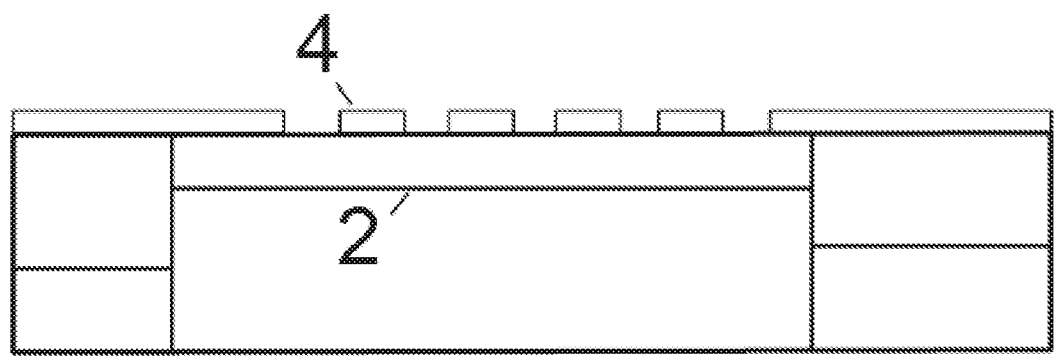
FIG. 2 is a schematic diagram of a sample after the photoresist is spin-coated and patterned according to the present disclosure.

In the step 4, the photoresist is patterned and multiple photoresist mesas are retained in the patterned photoresist. The step of patterning the photoresist determines the layout of the graphite mesas formed in the subsequent steps. The photoresist could be patterned by electron beam etching method. The average size of the formed photoresist mesas (square or circular) could be 1 μm to 30 μm, and the average interval between the photoresist mesas could be 1 μm to 100 μm. The etched graphite mesas have corresponding average size and average intervals as shown in FIG. 2.

Figure 3:
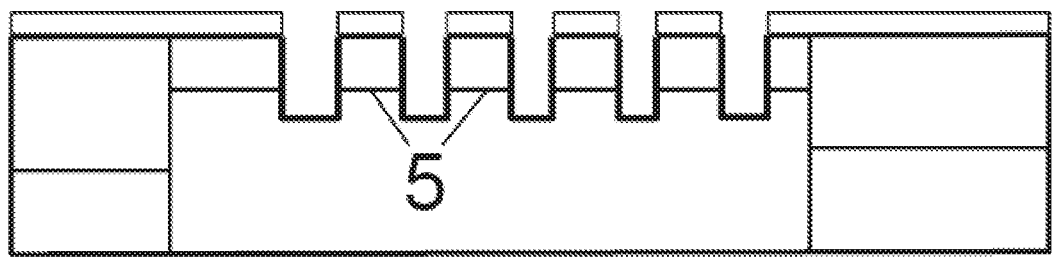
FIG. 3 is a schematic diagram of a sample after a substrate is etched so as to form a graphite mesa array according to the present disclosure.

In the step 5, the substrate is etched and part of the substrate that is not protected by the photoresist is removed, so as to form multiple graphite mesas. The etching method could be, for example, RIE. Based on the measurement data in the step 2, especially the grain thickness data in the region where the mesa structures are located, the etching time of RIE is strictly controlled during the etching process so that the etching depth is greater than the thickness of the grain of the outermost layer of the graphite and less than the distance from the outermost layer of the graphite to the bottom of the second grain as shown in FIG. 3.

Figure 4:
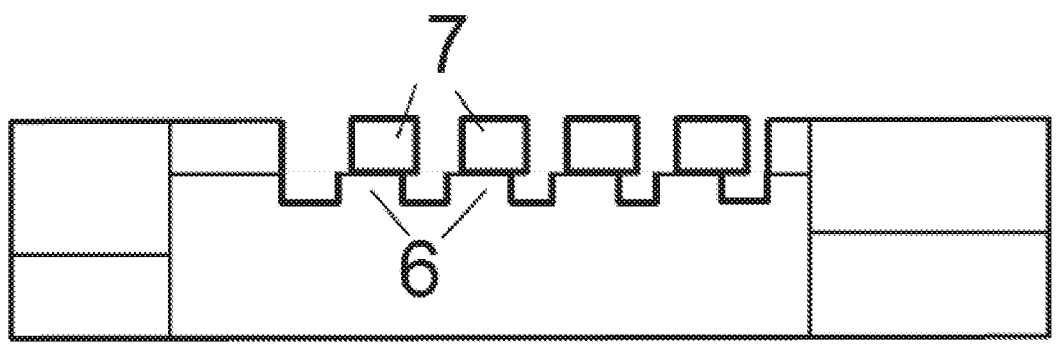
FIG. 4 is a schematic diagram illustrating that after residual photoresist is removed, a graphite slider array in a finished sample has uniform easy-slip surfaces and thickness according to the present disclosure.

In the step 6, residual photoresist is removed and the processing is completed so as to obtain a batch of graphite slider arrays. The horizontal grain boundaries in the HOPG now become uniform easy-slip interfaces of the graphite slider arrays as shown in FIG. 4. Different graphite mesas in the same batch of arrays will be cleaved at the same height, so a good consistency of the graphite slider arrays is ensured.

In particular, each graphite slider could also have a connection layer, such as $SiO_2$. A specific manufacturing method is described below.

In step 1, a HOPG is selected which has relatively flat surfaces and layered structures and has single crystal grains with a large size and a large thickness.

In step 2, through non-destructive examination on three-dimensional grain structures near surfaces of the HOPGs, information of polycrystalline structures near the surfaces of the HOPG is obtained, as shown in FIG. 1. A single crystal region 3 with a relatively large area could be accurately selected on the surfaces of the HOPG.

In step 3, a connection layer is deposited on the HOPG and then the photoresist is coated on the connection layer, where the connection layer may be $SiO_2$, the thickness of the connection layer may be, for example, 50 nm to 500 nm, and the $SiO_2$ connection layer may be deposited by plasma CVD. Covering of the photoresist may be performed by spin-coating.

Figure 5:
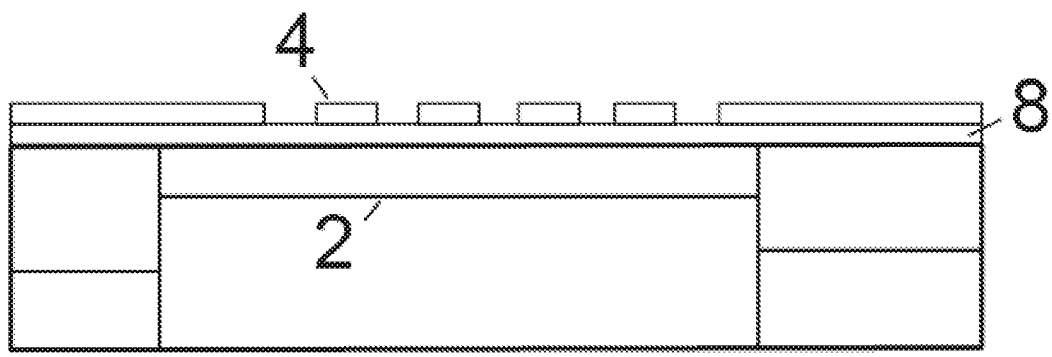
FIG. 5 is a schematic diagram of a sample with a connection layer after the photoresist is spin-coated and patterned according to the present disclosure.

In step 4, the photoresist is patterned and multiple photoresist mesas are retained in the patterned photoresist. The photoresist could be patterned by electron beam etching method. The average size of the formed photoresist mesas could be 1 μm to 30 μm, and the average interval between the photoresist mesas is 1 μm to 100 μm. The etched graphite mesa structures have corresponding average size and average intervals. A sample after the photoresist is patterned is shown in FIG. 5.

Figure 6:
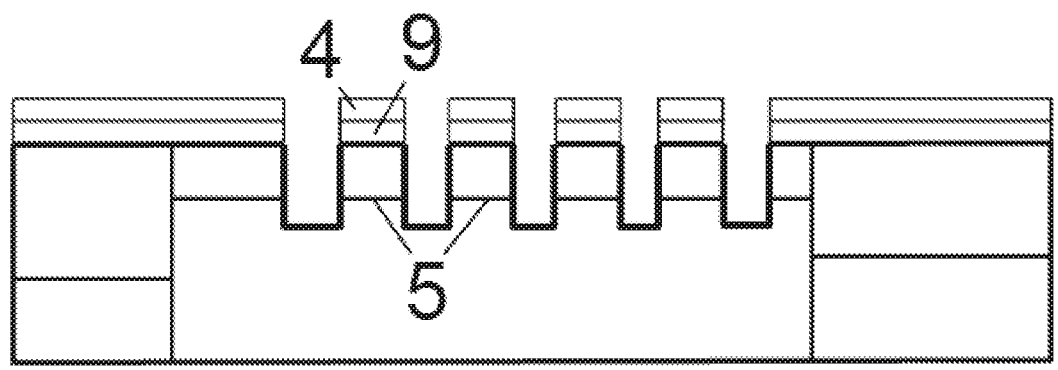
FIG. 6 is a schematic diagram of a sample after the connection layer and the substrate are etched so as to form a graphite mesa array according to the present disclosure.

In step 5, the connection layer and the graphite substrate are sequentially etched, so as to remove the connection layer and part of the graphite that are not protected by the photoresist, thereby forming multiple graphite mesa structures with connection layers. Each connection layer is located on the top side of the corresponding graphite mesa and may be described as a connection layer on top of the graphite mesa, the connection layer may be $SiO_2$ and is used to improve the connection effect between the graphite substrate and the other structure. The etching could be, for example, RIE. When the graphite substrate is etched, the etching time of RIE is strictly controlled, and based on the measurement data in the step 2, the etching depth is greater than the thickness of the grain of the outermost layer of graphite and less than the distance from the outermost layer of the graphite to the bottom of the second grain as shown in FIG. 6.

Figure 7:
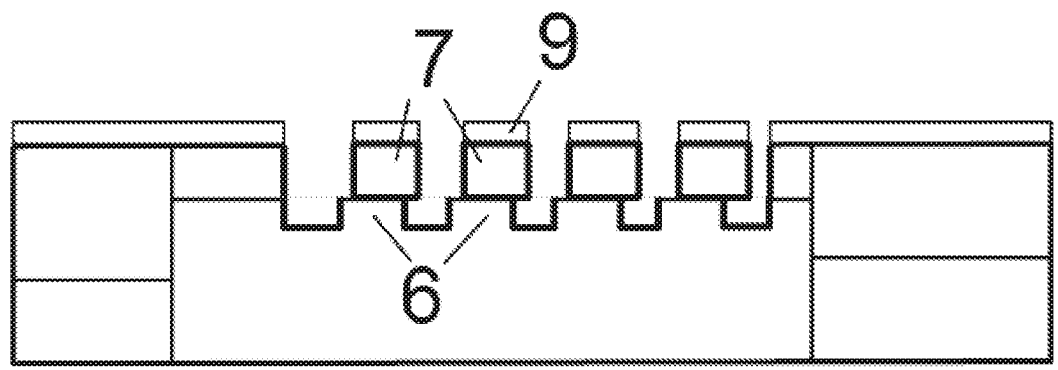
FIG. 7 is a schematic diagram of a finished sample with a connection layer according to the present disclosure.

In step 6, residual photoresist is removed and the processing is completed so as to obtain a batch of graphite slider arrays with connection layers and uniform easy-slip surfaces as shown in FIG. 7.

INDUSTRIAL APPLICABILITY

The above are only preferred embodiments of the present disclosure. Any equivalent variations or modifications made according to the scope of the claims in the present disclosure should belong to the coverage scope of the claims in the present disclosure.

What is claimed is:

1. A manufacturing method for graphite slider array, comprising:
   in step 1: covering at least photoresist on highly oriented pyrolytic graphite (HOPG);
   in step 2: patterning the photoresist and retaining a plurality of photoresist mesas;
   in step 3: etching the HOPG and removing part of the HOPG that is not protected by the photoresist, so as to form a plurality of graphite mesas; and
   in step 4: removing residual photoresist to obtain the graphite slider array;
   before the step 1, performing an examination on three-dimensional grain structures near surfaces of the HOPG to obtain grain information of polycrystalline structures near the surfaces of the HOPG; and
   in the step 3, based on the grain information of the polycrystalline structures, controlling the etching process so that each of the plurality of graphite mesas made through the etching process comprises only one horizontal grain boundary layer.

2. The manufacturing method of claim 1, wherein in the step 1, the HOPG is covered by the photoresist with spin-coating.

3. The manufacturing method of claim 1, wherein in the step 2, the average size of each of the plurality of photoresist mesas is 1 μm to 30 μm, and the average interval between the plurality of photoresist mesas is 1 μm to 100 μm.

4. The manufacturing method of claim 1, wherein in the step 3, the etching is reactive ion etching (RIE).

5. The manufacturing method of claim 1, wherein the examination is electron backscatter diffraction (EBSD), X-ray scattering, and/or ellipsometry.

6. The manufacturing method of claim 1, wherein the grain information includes a grain thickness, a grain length and a grain width.

7. The manufacturing method of claim 6, wherein etching time is controlled to make an etching depth greater than the thickness of the grain of the outermost layer of graphite and less than a distance from the outermost layer of the graphite to a bottom of a second grain of the graphite.

8. The manufacturing method of claim 1, wherein each of the plurality of graphite mesas is covered by a connection layer (9) on a top of the each graphite mesa.

9. The manufacturing method of claim 8, wherein a connection layer (8) is deposited on the HOPG by a plasma chemical vapor deposition (CVD) method to form the connection layer (9) on the top of the each graphite mesa.

10. The manufacturing method of claim 9, wherein a material of the connection layer (8) is $SiO_2$, and a thickness of the connection layer (8) is 50 nm to 500 nm.

* * * * *